(12) United States Patent
Feng et al.

(10) Patent No.: US 10,139,849 B2
(45) Date of Patent: Nov. 27, 2018

(54) SIMPLE CMOS THRESHOLD VOLTAGE EXTRACTION CIRCUIT

(71) Applicant: Honeywell International Inc., Morris Plains, NJ (US)

(72) Inventors: Xiaoxin Feng, Shakopee, MN (US); Weston Roper, Shakopee, MN (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 15/497,051

(22) Filed: Apr. 25, 2017

(65) Prior Publication Data

US 2018/0307262 A1    Oct. 25, 2018

(51) Int. Cl.
| | |
|---|---|
| H03F 3/00 | (2006.01) |
| G05F 3/26 | (2006.01) |
| G05F 3/16 | (2006.01) |
| G05F 1/10 | (2006.01) |
| G05F 3/30 | (2006.01) |
| G05F 3/24 | (2006.01) |
| H03K 17/082 | (2006.01) |
| H03K 19/003 | (2006.01) |
| H03K 5/00 | (2006.01) |

(52) U.S. Cl.
CPC ............... *G05F 3/242* (2013.01); *G05F 1/10* (2013.01); *G05F 3/26* (2013.01); *H03K 17/0822* (2013.01); *H03K 19/00384* (2013.01); *H03K 2005/0028* (2013.01)

(58) Field of Classification Search
CPC .. G05F 3/242; G05F 1/10; G05F 3/26; H03K 17/0822; H03K 19/00384; H03K 2005/0028

USPC .............................. 327/530–546; 323/312–317
See application file for complete search history.

(56) References Cited

U.S. PATENT DOCUMENTS

| | | | | |
|---|---|---|---|---|
| 5,488,329 A | * | 1/1996 | Ridgers ...................... | G05F 3/30 323/313 |
| 6,078,207 A | * | 6/2000 | Oguri .................. | H03F 3/45183 327/319 |
| 6,528,979 B2 | * | 3/2003 | Kimura ................... | G05F 3/267 323/313 |

(Continued)

FOREIGN PATENT DOCUMENTS

| CN | 103309392 A | 9/2013 |
|---|---|---|
| EP | 2706426 A2 | 3/2014 |

OTHER PUBLICATIONS

Vlassis, et al., "Low-voltage CMOS VT extractor," Electronics Letters, Aug. 16, 2007, vol. 43, No. 17, 2 pp.

(Continued)

*Primary Examiner* — Brandon S Cole
(74) *Attorney, Agent, or Firm* — Shumaker & Sieffert, P.A.

(57) ABSTRACT

The disclosure is directed to a simple, inexpensive circuit to extract the complementary metal-oxide-semiconductor (CMOS) threshold voltage (Vt) from an integrated circuit. The threshold voltage may be used elsewhere in the circuit for a variety of purposes. One example use of threshold voltage is to sense the temperature of the circuit. The CMOS Vt extraction circuit of this disclosure includes a current mirror and an arrangement of well-matched transistors and resistors that takes advantage of the square law equation. The structure of the circuit may make it well suited to applications that benefit from low-power radiation hardened circuits.

20 Claims, 4 Drawing Sheets

(56) References Cited

U.S. PATENT DOCUMENTS

| | | | |
|---|---|---|---|
| 6,788,041 B2 * | 9/2004 | Gheorghe | G05F 3/30 |
| | | | 323/313 |
| 6,844,772 B2 | 1/2005 | Hoon et al. | |
| 6,919,753 B2 | 7/2005 | Wang et al. | |
| 7,157,893 B2 * | 1/2007 | Lee | G05F 3/245 |
| | | | 323/314 |
| 7,576,598 B2 | 8/2009 | Marinca | |
| 7,944,272 B2 * | 5/2011 | Nishi | G05F 3/30 |
| | | | 323/313 |
| 8,866,539 B2 * | 10/2014 | Sano | G05F 3/30 |
| | | | 327/513 |
| 2002/0158614 A1 * | 10/2002 | Kimura | G05F 3/267 |
| | | | 323/315 |
| 2002/0163379 A1 * | 11/2002 | Kimura | G05F 3/262 |
| | | | 327/540 |
| 2004/0113682 A1 * | 6/2004 | Hoon | G05F 3/262 |
| | | | 327/543 |
| 2006/0091940 A1 * | 5/2006 | Kimura | G05F 3/262 |
| | | | 327/543 |
| 2011/0121809 A1 | 5/2011 | Galeano et al. | |
| 2011/0193544 A1 | 8/2011 | Iacob et al. | |
| 2014/0340143 A1 | 11/2014 | Georgiou et al. | |

OTHER PUBLICATIONS

Talebbeydokhti, et al., "Constant Transconductance Bias Circuit with an On-Chip Resistor," ISCAS May 2006, pp. 2857-2860.

Toledo, et al., "Threshold voltage extraction circuit for low voltage CMOS design using basic long-channel MOSFET," Feb. 24-27, 2015 IEEE Conference, 4 pp.

Lee et al., "Voltage References and Biasing," Handout #20: EE214 Fall 2002; Nov. 27, 2002, 15 pp.

Thomas et al., "MOSFET Threshold Voltage Extractor Circuits Based on Square-Law Behavior," IEEE, Circuits and Systems, 1999, Aug. 8-11, 1999; pp. 1118-1121.

Slavenko, et al., "CMOS Vt extractor," VLSI Laboratory, Jul. 2010, 12 slides.

Fikos, et al., "Low-Voltage Low-Power Accurate CMOS Vt Extractor," IEEE Transactions on Circuits and Systems, vol. 48, No. 6, Jun. 2011, pp. 626-628.

* cited by examiner

SIMPLE CMOS THRESHOLD VOLTAGE EXTRACTION CIRCUIT

TECHNICAL FIELD

This disclosure relates to measuring a CMOS threshold voltage.

BACKGROUND

The threshold voltage (Vt) of a field-effect transistor (FET) is the minimum gate-to-source voltage differential that is needed to create a conducting path between the source and drain terminals. Threshold voltage for a field effect transistor (FET) may vary from manufacturer to manufacturer or for the same manufacturer Vt may vary for different manufacturing processes or integrated circuit designs. For the complementary metal-oxide-semiconductor (CMOS) process, Vt can be a well-controlled parameter for a given CMOS manufacturing process. CMOS Vt may vary with temperature and may be used, for example, as the temperature sensing voltage in circuits where temperature compensation is needed. In some example circuits, a diode may also be used for temperature compensation. However, a diode may need approximately 600 mV to 800 mV voltage range to be able to measure temperature over a useful temperature range. In low power supply voltage applications, attempting to use a diode may make the buffer or opamp reading this voltage more difficult to design.

SUMMARY

In general, this disclosure is directed to a circuit to extract the threshold voltage (Vt) from a CMOS integrated circuit. For a well-controlled CMOS process, Vt may have some useful properties such as Vt may vary linearly with temperature. The threshold voltage may be used elsewhere in the circuit for a variety of purposes. One example use of threshold voltage is to sense the temperature of the circuit.

In one example, the disclosure is directed to a circuit comprising: first circuitry comprising a first current mirror; a first resistor, and a second resistor, wherein the first resistor and the second resistor are substantially matched. A second circuitry comprising a second current mirror, wherein: the second current mirror comprises a first transistor and a second transistor, a width-to-length ratio of the second transistor is greater than a width-to-length ratio of the first transistor. A first current through the first transistor is substantially equal to a second current through the second transistor, and the second current passes through the first resistor. The circuit includes a third transistor, wherein: the second transistor and the third transistor are substantially matched, a third current through the third transistor is substantially equal to the second current through the second transistor, the third current passes through the second resistor, and an output voltage of the circuit is a drain-source voltage across the third transistor.

In another example, the disclosure is directed to a system comprising, a complementary metal-oxide-semiconductor (CMOS) threshold voltage (Vt) extraction circuit, the Vt extraction circuit comprising: a first circuitry, comprising a first current mirror, a first resistor; and a second resistor, wherein the first resistor and the second resistor are substantially matched. A second circuitry comprising a second current mirror, wherein: the second current mirror comprises a first transistor and a second transistor, a width-to-length ratio of the second transistor is greater than a width-to-length ratio of the first transistor. A first current through the first transistor is substantially equal to a second current through the second transistor, and the second current passes through the first resistor; and a third transistor, wherein the second transistor and the third transistor are substantially matched. A third current through the third transistor is substantially equal to the second current through the second transistor, the third current passes through the second resistor, and a first output voltage of the Vt extraction circuit is a drain-source voltage across the third transistor. The system includes an output leg, the output leg comprising: a resistance substantially equal to twice a resistance of the first resistor, wherein a fourth current through the resistance is substantially equal to the first current; a second output terminal, wherein a second output signal at the second output terminal comprises a voltage proportional to absolute temperature (V_PTAT).

In another example, the disclosure is directed to a method of determining a complementary metal-oxide-semiconductor (CMOS) threshold voltage (Vt), the method comprising: directing a first current through a first transistor, directing a second current through a second transistor, wherein: the second current is substantially equal to the first current, the second current passes through a first resistor connected in series to the second transistor, and the second transistor and the first resistor are configured such that a gate-source voltage of the first transistor equals a sum of a voltage across the first resistor plus a gate-source voltage of the second transistor. The method further comprises directing a third current through a third transistor, wherein: the third current is substantially equal to the first current, the third current passes through a second resistor connected to the third transistor, and a gate-source voltage of the third transistor is substantially equal to a drain-source voltage across the second transistor. The third transistor and the second transistor are substantially matched and the second resistor and the first resistor are substantially matched. The method further comprises determining the drain-source voltage of the third transistor.

The details of one or more examples of the disclosure are set forth in the accompanying drawings and the description below. Other features, objects, and advantages of the disclosure will be apparent from the description and drawings, and from the claims.

DETAILED DESCRIPTION

In general, this disclosure is directed to a circuit to extract the complementary metal-oxide-semiconductor (CMOS) threshold voltage (Vt) from an integrated circuit. The CMOS threshold voltage may be used elsewhere in the circuit for a variety of purposes. One example use of threshold voltage is to sense the temperature of the circuit. Knowing the temperature of a circuit may be desirable for a CMOS integrated circuit because other components within the circuit may also vary with temperature. For example, the resistance value of a resistor may also vary with temperature and may affect the performance of a circuit. Circuits used in applications that must operate over a wide temperature range may need to compensate for the effects of temperature to ensure consistent circuit performance. For example, a circuit used in an aircraft may operate at one temperature on the ground and a significantly lower temperature when operating at altitude. A circuit used in space applications, such as a satellite may operate at a very high temperature during a part of an orbit when exposed to the sun and a much lower temperature when in the shadow of Earth.

The CMOS Vt extraction circuit of this disclosure includes current mirrors and an arrangement of well-matched transistors and resistors that takes advantage of the square law equation. The Vt extraction circuit of this disclosure provides several advantages over conventional circuits that may also extract threshold voltages. The Vt extraction circuit of this disclosure is a relatively simple arrangement that uses few components and takes up little area in an integrated circuit. The Vt extraction circuit may be operated with a low voltage supply and consume little power. As the Vt extraction circuit of this disclosure is relatively simple and uses a relatively small number of components, it may also be inexpensive compared to some other existing Vt extraction circuits.

Additionally, by using only resistors along with p-channel metal-oxide semiconductor (pMOS) and n-channel metal-oxide semiconductor (nMOS) transistors, the Vt extraction circuit of this disclosure may have advantages in radiation hardened applications. For example, when compared to conventional temperature sensing circuits that use diodes, lateral PNP or NPN transistors, opamps or similar components, the Vt extraction circuit of this disclosure may be more resistant to degradation by radiation. Radiation hardened circuits that can operate at low voltage may be valuable in military applications or other applications, such as space, science research, and similar applications that involve radiation exposure. Note that Vt for pMOS will be referred to as Vtp and Vt for nMOS will be referred to as Vtn in this disclosure.

Figure 1:
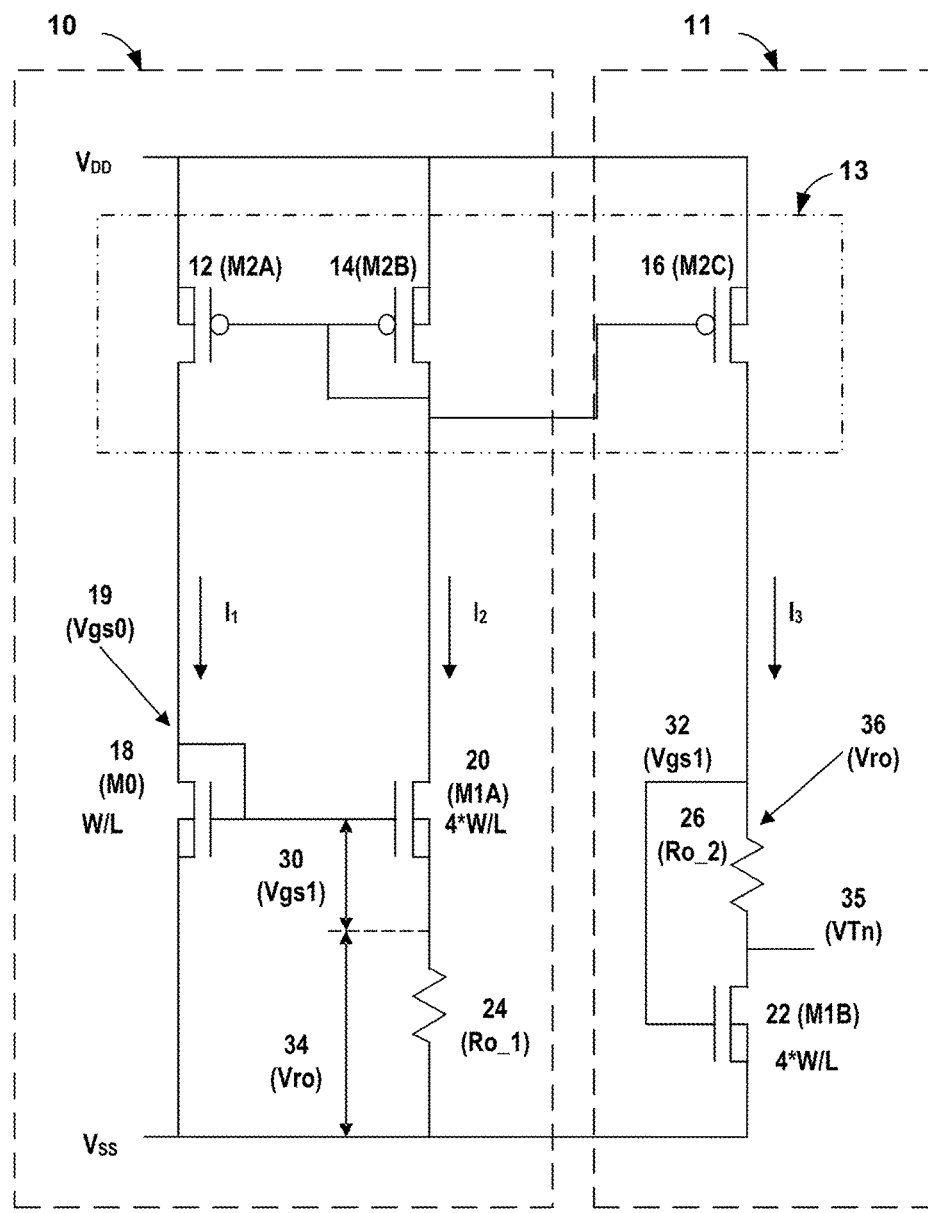
FIG. 1 is a schematic diagram illustrating an example circuit to extract the threshold voltage from a CMOS integrated circuit.

FIG. 1 is a schematic diagram illustrating an example circuit to extract the threshold voltage from a CMOS integrated circuit (IC). The example circuit of FIG. 1 uses the properties of the square law, described in more detail below, with an arrangement of current mirrors and pairs of components that have substantially the same value to output Vt. The output value of Vt may be used elsewhere on the CMOS IC for a variety of purposes, including temperature compensation.

The example circuit of FIG. 1 includes three legs, indicated by the currents $I_1$, $I_2$ and $I_3$, with substantially the same current running through each leg. The circuit of FIG. 1 includes a first current mirror 13, which includes three well-matched pMOS transistors 12-16 (M2A-M2C), a second current mirror, which includes nMOS transistors 18 (M0) and 20 (M1A) and an output portion 11 which includes a third transistor 22 (M1B). The circuit of FIG. 1 also includes two well-matched resistors 24 and 26 (Ro_1 and Ro_2).

Matching components may depend on several factors including how components are used in a circuit (electrical design) and the physical design. In regards to electrical design, two transistors, as an example, may be considered substantially matched if the large signal model parameters are equal. Where two transistors are substantially matched, if all terminal voltages of one transistor are equal to the terminal voltages of the other transistor, then the terminal currents will be matched. Another way of describing transistor matching may include if the gate-source voltages of two or more field effect transistors (FET) are equal and the transistors are matched and operating in the saturation region, then the currents through the FETs are related by the width-to-length (W/L) ratios of the individual FETs. When discussing components such as transistors or resistors or values such as current values or voltage values, the terms "matched" and "equal" should not be construed to mean perfectly matched or perfectly equal. Instead, it should be understood that such components are equal or matched within the manufacturing and measurement tolerances typical in the art. Moreover, the terms "well matched," "substantially matched," "substantially equal," and "approximately equal" in this disclosure should be interpreted to mean that components or values are matched or equal within a threshold amount, such as within 5 or 10%.

Physical design may also impact matching of components. For example, to obtain good matching for resistors, some techniques include using substantially identical structures, with, for example, the same size, shape, and interconnections, including end contacts; placing matched elements physically close to each other on the wafer; placing matched elements with the same orientation; and using interdigitized structures. To obtain good matching, circuit designs may also account for boundary effects, for example by using "dummy" structures around the matched components. To obtain good matching, circuit designs may also minimize or compensate for compressive effects and the impact of piezoresistance.

The material and process may also affect matching, such as using polysilicon or diffused material. For example, the temperature coefficient (change of resistance per degree Celsius) of a diffused or polysilicon IC resistor may be in the hundreds of ppm/° C., while the temperature coefficient for isolation or well-type resistors may be in the thousands of ppm/° C. Also, polysilicon resistors may have a substantially linear voltage coefficient, diffused resistors may also have a substantially linear voltage coefficient but less so than polysilicon. Isolation or well-type resistors may have a non-linear voltage coefficient (ppm/volt). Polysilicon and diffused resistors may have advantages over other materials and processes where matching is important. The components of the example circuit of FIG. 1 may use one or more of the techniques above to ensure the groups of components as described are well matched. Matching may be done in pairs, such as between 24 (Ro_1) and 26 (Ro_2) or in larger groups such as the matching between transistors 12 (M2A), 14 (M2B) and 16 (M2C).

In the example of FIG. 1, the sources of pMOS transistors 12 (M2A)-16 (M2C) connect to VDD. The drain of transistor 12 (M2A) connects to the drain and gate of transistor 18 (M0). The source of nMOS transistor 18 (M0) connects to VSS. The current $I_1$ through transistor 12 (M2A) is the same as the current $I_1$ through transistor 18 (M0). In this disclosure unless otherwise noted, "connected" means a component is directly connected to another component without any intervening components. Connected means a direct electrical connection rather than an indirect coupling, such as parasitic capacitance, unless otherwise noted.

The drain and gate of transistor 14 (M2B) connects to the drain of transistor 20 (M1A). The source of transistor 20 (M1A) connects to ground through resistor 24 (Ro_1). Because of the current mirror formed by 12 (M2A) and 14 (M2B), the current through 20 (M1A) and resistor 24 (Ro_1)

is the same as the current through 14 (M2B) and substantially equal to the current through 12 (M2A) and 18 (M0). This circuit arrangement causes the gate-source voltage of the transistor 18 (M0) to equal the sum of the voltage across the resistor 24 (Ro_1), i.e. 34 (VRo), plus a gate-source voltage (30 Vgs1) of transistor 20 (M1A).

The circuit enclosed by the dashed lines of box 10 may also be considered a constant transconductance (gm) bias circuit. In operation, some examples of a constant-gm bias circuit may convert a constant-gm to a fixed current by using a voltage provided by a band-gap reference. As with other properties of a circuit such as transconductance, voltages, and resistance may be affected by variations in manufacturing or operation of the circuit. For example, an IC manufactured in one location on a given day may perform differently than the same IC manufactured in a different location or on different equipment, even within the same manufacturer. Changes in performance because of differences in manufacturing or operating conditions are called process, voltage and temperature (PVT) variations.

If the transconductance and the reference voltage are independent of PVT then the current generated using these parameters may also be PVT independent and hence can be used as a master bias current in some examples. There are several ways of implementing PVT independent constant-gm bias circuits. The resistor-referred constant-gm bias circuit as shown in FIG. 1 (box 10) is one example. However, unlike some examples of conventional constant-gm bias circuits that may use an off-chip resistor, the example circuit of FIG. 1 may use an on-chip resistor 24 (Ro_1). Circuits that use an off-chip resistor will have a connection from the IC to the off-chip components. This may be a lead from the IC connected to a pad on a printed circuit board (PCB), for example. Any pads or traces on a circuit board may be subject to parasitic capacitance or inductance. The arrangement in the circuit of FIG. 1 may avoid possible parasitic capacitance associated with the pad and the off-chip resistor that may be found in conventional circuits. An additional advantage of the circuit of box 10 in avoiding the need for external components may include to reduce the overall cost and size of the system associated with external components.

The third leg of the first current mirror ($I_3$) includes transistor 16 (M2C). The drain of transistor 16 (M2C) connects to the gate of transistor 22 (M1B). The drain of transistor 16 (M2C) also connects to the drain of transistor 22 (M1B) through resistor 26 (Ro_2). In other words, the gate of transistor 22 (M1B) connects to the node between the drain of transistor 16 (M2C) and resistor 26 (Ro_2). The source of transistor 22 (M1B) connects to VSS. The dimensions and other properties of transistor 22 (M1B) and transistor 20 (M1A) are well matched, as described above. The W/L ratio of transistor 22 (M1B) is the same as transistor 20 (M1A). The W/L ratio of transistor 22 (M1B), and transistor 20 (M1A), may, for example, be four times the size of transistor 18 (M0).

The constant-gm circuit is subject to the square law:

$$I = \frac{\mu \varepsilon}{2} \frac{W}{L} (Vgs - Vt)^2 \quad (1)$$

where W/L is the width-to-length ratio, µε/2 may be considered a constant in this example, and Vtn is the threshold voltage for the nMOS transistors, as described above. Because the W/L ratio of transistor 20 (M1A) is four times larger than the W/L ratio of 18 (M0), and the current flowing through 18 (M0) is substantially the same as 20 (M1A), the below equations apply:

$$Vgs0 = Vgs1 + VRo \quad (2)$$

$$VRo = Vgs0 - Vgs1 = Vdsat1 = (Vgs1 - Vtn) \quad (3)$$

where Vdsat1 is the saturation voltage for transistor 20 (M1A) for the gate-source voltage Vgs1. Because the currents through each leg are substantially equal, the square law of equation (1) yields:

$$I = \frac{\mu \varepsilon}{2} \frac{W}{L} (Vgs0 - Vtn)^2 = \frac{\mu \varepsilon}{2} \frac{4 \times W}{L} (Vgs1 - Vtn)^2 \quad (4)$$

Rearranging and cancelling terms yields:

$$Vtn = Vgs1 - VRo. \quad (5)$$

Because resistors 26 (Ro_2) and 24 (Ro_1) are substantially equal and transistors 20 (M1A) and 22 (M1B) are well matched with the same W/L ratio, the third leg of the circuit of FIG. 1 outputs 35 (Vtn) as the drain-source voltage of transistor 22 (M1B). In this example, the gate-source voltage of transistor 22 (M1B) is substantially equal to the gate-source voltage 30 (Vgs1) of transistor 20 (M1A). In operation, the circuit of FIG. 1 will operate with VDD>Vgs1+Vdsat1. In some examples, VDD may be as low as 800 mV. In this example, Vdsat1 may be smaller than Vtn. The circuit of FIG. 1 may output the threshold voltage 35 (Vtn) through an interface, such as a terminal, pad or similar interface on an IC or similar structure. In other examples, the circuit may output Vtn directly to another portion of a circuit on the same IC through an interface, such as a metal trace or other conductive trace without going off-chip.

The circuit of FIG. 1 may have the advantage of an accurate output of 35 (Vtn) and consume little power. Unlike conventional circuits that may require one or more opamps, or other components, to extract the threshold voltage, the Vt extraction circuit of this disclosure may consume less area on an IC, does not need external components, consume little power and operate with a lower supply voltage. By only using the transistors and resistors described above, the circuit of this disclosure may also provide advantages for applications requiring radiation hardened circuits. Additionally, using matching components in the configuration described above, the circuit of this disclosure may include an additional advantage of being robust over a range of PVT variation.

In other examples, a similar circuit could extract Vtp, the threshold voltage for pMOS. To extract Vtp, the components may be rearranged so that the current mirror which includes pMOS transistors 12 (M2A)-16 (M2C) becomes a similar current mirror using nMOS transistors. Similarly, 18 (M0), 20 (M1A) and 12 (M2A) may be pMOS transistors, while VDD and VSS and the locations of the resistors are rearranged to ensure proper operation to extract Vtp.

Figure 2:
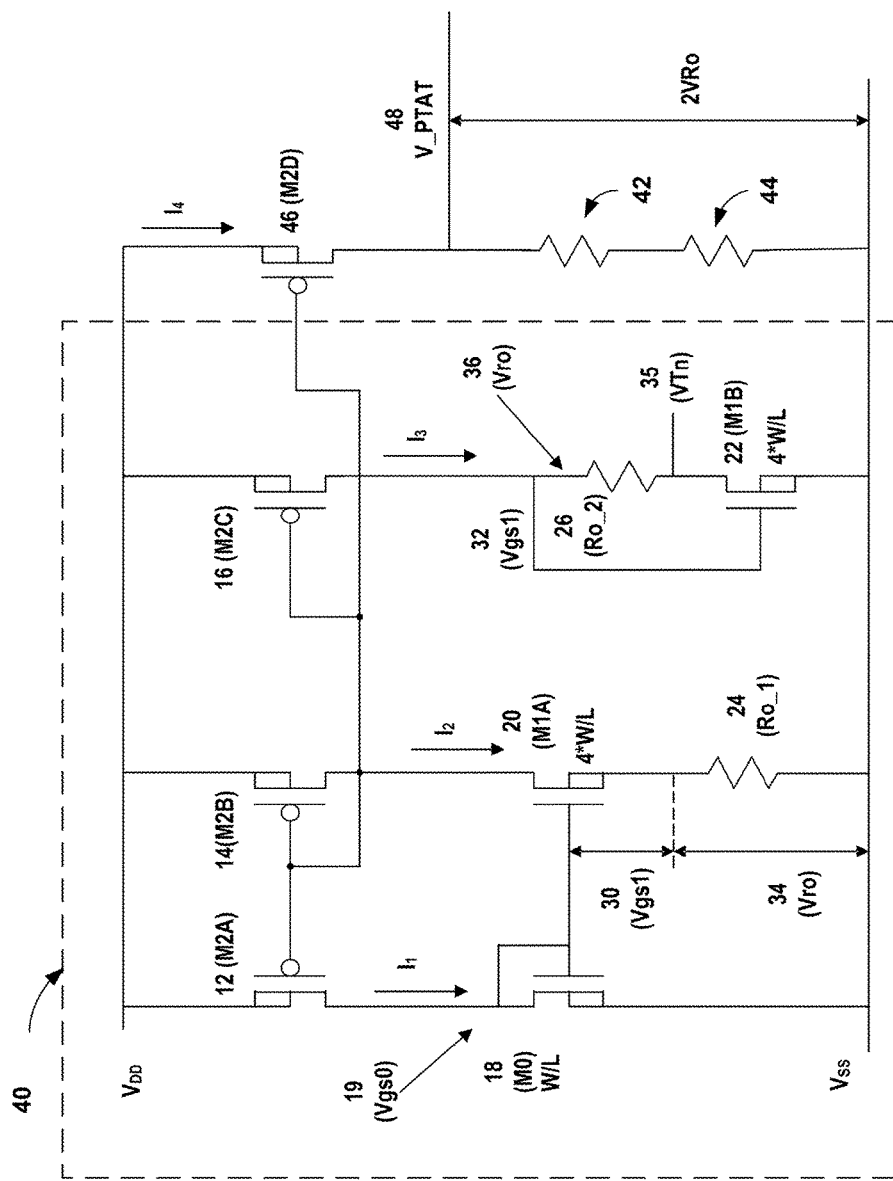
FIG. 2 is a schematic diagram illustrating an example application of a circuit to extract the threshold voltage from a CMOS integrated circuit.

FIG. 2 is a schematic diagram illustrating an example application of a circuit to extract the threshold voltage from a CMOS IC. The circuit of FIG. 2 includes a fourth leg that outputs a complementary proportional to absolute temperature (PTAT) voltage. This is only one example application of the Vt extraction circuit of this disclosure. In other examples, the Vt extraction circuit of this disclosure may be used in a variety of other applications. Some reference labels are the same between FIGS. 1 and 2, which indicates the same components in the same circuit arrangement between the two figures.

The circuit of FIG. 2 includes the circuit depicted in FIG. 1, enclosed by box 40, and a fourth leg added to the first current mirror 13, indicated by current $I_4$, which includes transistor 46 (M2D). The fourth leg further includes two resistors with value Ro (42 and 44). In other examples, the resistors 42 and 44 may be combined into a single resistor with value 2*Ro. However, as described above, two single resistors with value Ro may have advantages of improved matching with resistors 24 (Ro_1) and 26 (Ro_2) because, for example, the width, length, orientation and connections may be designed to be the same for individual resistors compared to a single, larger resistor. The source of 46 (M2D) connects to VDD. Resistor 42 is connected in series with resistor 44 and the drain of 46 (M2D) connects to VSS through resistors 42 and 44, such that the current $I_4$ through transistor 46 (M2D) is the same as the current through each resistor 42 and 44.

In operation, the Vtn extraction circuit in box 40 operates the same as described above for FIG. 1. The current $I_4$, through transistor M2D is substantially equal to the current flowing through the other legs of the circuit of FIG. 2, such as through transistor 18 (M0). Rearranging equation (5) as described above in relation to FIG. 1:

$$Vgs1 = Vtn + VRo \quad (6)$$

and combining with equation (2) above yields:

$$Vgs0 = \text{a constant} = Vtn + 2 \times VRo. \quad (7)$$

35 (Vtn) is a voltage that is complementary to absolute temperature (V_CTAT). Therefore, from equation (6), 35 (Vtn) and 2VRo (48 V_PTAT) are a complementary pair of temperature dependent voltages, which may be used in many temperature compensation applications.

Figure 3:
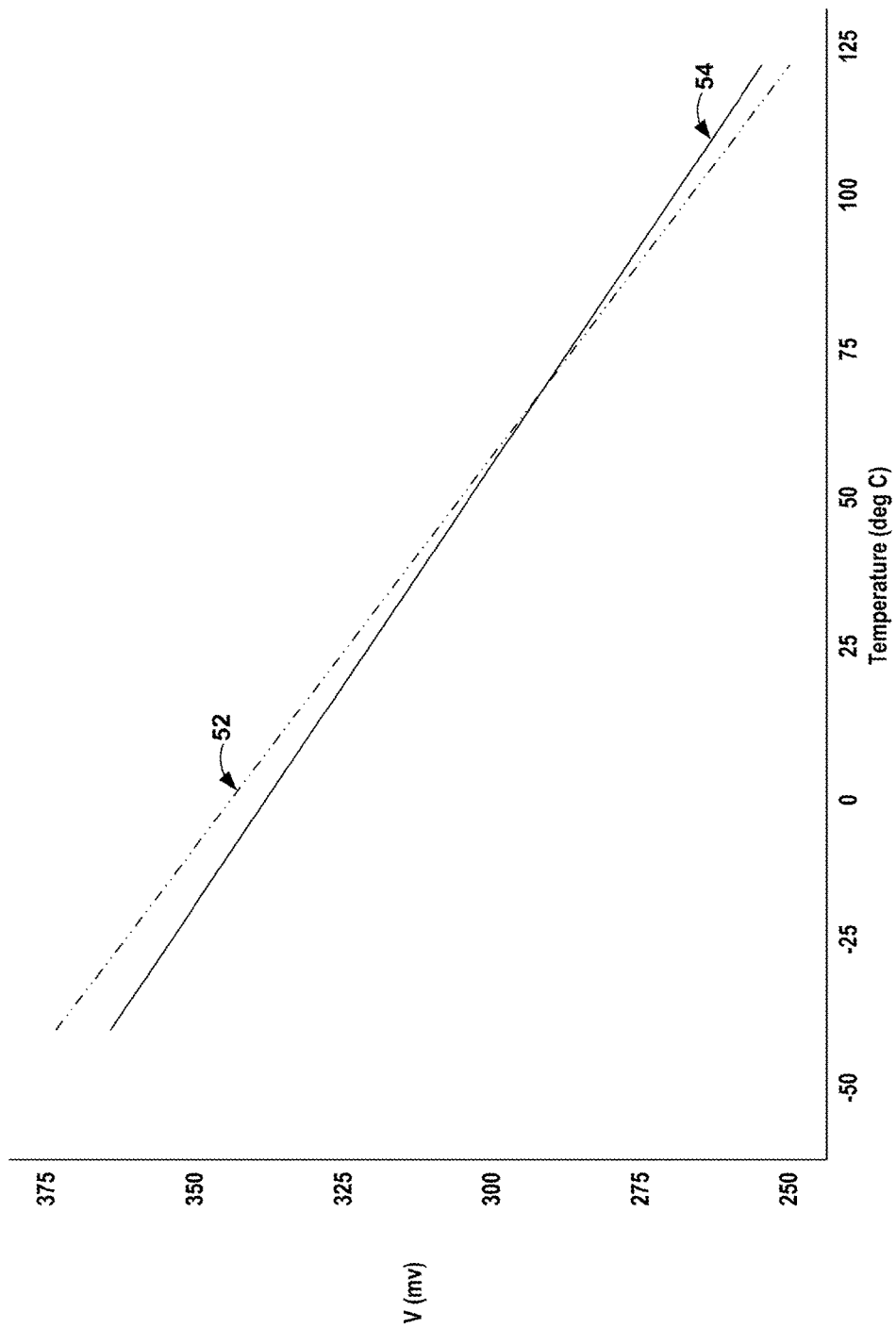
FIG. 3 is a graph illustrating an example performance of the Vt extraction circuit depicted in FIG. 1.

FIG. 3 is a graph illustrating an example performance of the Vt extraction circuit depicted in FIG. 1. The graph of FIG. 3 depicts performance of a physical sample Vt extraction circuit and simulated performance of a modeled version of a Vt extraction circuit.

The testing for both the simulated circuit and a physical circuit were run over a temperature range of −40° C. to 120° C. The performance of the modeled Vt extraction circuit (52) showed a linear response with a voltage of 373 mV at −40° C. to a voltage of 255 mV at 120° C. This is a ΔVt=117.3 mV. The performance of the modeled Vt extraction circuit (54) showed a linear response with a voltage of 365 mV at −40° C. to a voltage of 260 mV at 120° C. This is a ΔVt=106.4 mV. In this example, the difference between the simulated circuit and the physical circuit was less than 10% over the 160° C. range. The results of the testing demonstrated the Vt extraction circuit of this disclosure may be used to provide Vt output, e.g. where the output voltage of the circuit (Vt) linearly decreases as temperature rises. The testing conditions demonstrate that Vt extraction circuit may be used in lower voltage and low power applications.

Figure 4:
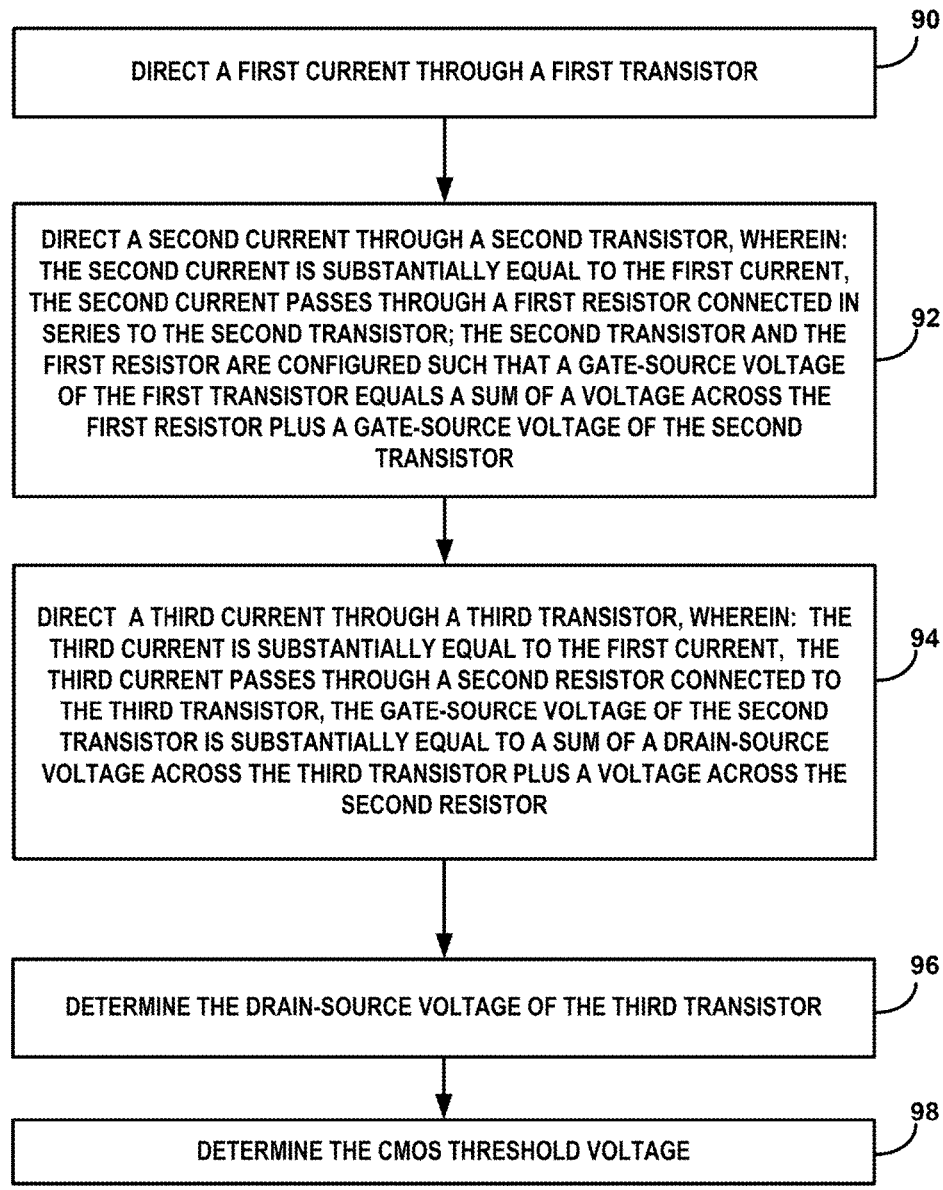
FIG. 4 is a flow chart illustrating an example operation of a threshold voltage extraction circuit of this disclosure.

FIG. 4 is a flow chart illustrating an example operation of a threshold voltage extraction circuit of this disclosure. The steps of FIG. 4 will be described in relation to FIG. 1.

The first current mirror circuit, which includes transistors 12 (M2A)-16 (M2C) directs a current, I through transistor 18 (M0), which has a width-to-length ratio of W/L (90). The drain-source current, I through 18 (M0) is the same as the drain-source current through transistor 12 (M2A). The drain-source voltage of transistor 18 (M0), in the example of FIG. 1 is the same as the gate-source voltage, Vgs0 of transistor 18 (M0).

The second leg of the first current mirror, which includes transistor 14 (M2B), directs a current $I_2$ through transistor 20 (M1A), which has a width-to-length ratio of 4 W/L (92). In other words, the width-to-length ratio of transistor 20 (M1A) is four times larger than the width-to-length ratio of transistor 18 (M0), as described above. The drain-source current, $I_2$ through transistor 20 (M1A) is substantially equal to the drain-source current $I_1$ through transistor 18 (M0). Because transistor 20 (M1A) is connected to VSS through resistor 24 (Ro_1), the current I, through 24 (Ro_1) is equal to the drain-source current of transistor 20 (M1A) (92). Transistors 18 (M0) and 20 (M1A) form a second current mirror, as described above. Transistors 18 (M0) and 20 (M1A), as arranged with 24 (Ro_1) in the example of FIG. 1 means that Vgs0=Vgs1+VRo, as described above in equation (2).

The third leg of the first current mirror 13, which includes transistor 16 (M2C), directs a current $I_3$ through transistor 22 (M1B) (94), which has a width-to-length ratio of 4 W/L, the same as transistor 20 (M1A). Transistors 20 (M1A) and 22 (M1B) are substantially matched as described above in relation to FIG. 1. Transistor 22 (M1B) is connected to transistor 16 (M2C) in series through resistor 26 (Ro_2). Therefore, the drain-source current $I_3$ of transistor 22 (M1B) is equal to the current $I_3$ through resistor 26 (Ro_2) and the drain-source current $I_3$ of transistor 16 (M2C), as well as substantially equal to the drain-source current $I_2$ of transistor 20 (M1A). Because transistor 20 (M1A) and transistor 22 (M1B) are substantially matched, and the currents through each transistor (M1A and M1B) are substantially equal (I3=I2), therefore the drain-source voltage of each transistor is substantially equal, within manufacturing and measurement tolerances ($V_{DS-M1A}=V_{DS-M1B}$). Therefore voltage 32 (Vgs1) will be substantially equal to voltage 30 (Vgs1), as described above in relation to FIG. 1.

The gate of transistor 22 (M1B) connects to the drain of transistor 16 (M2C). Therefore, the voltage (32 Vgs1) of transistor 22 (M1B) includes two components: VRo (36) and Vtn (35). Vgs1 (32) is substantially equal to the voltage across resistor 26 (Ro_2) (36 VRo) (94) plus Vtn (35). As described above in relation to equations (1)-(5), by determining the drain-source voltage (32 Vgs1) of transistor 22 (M1B) (96), the circuit of FIG. 1 may determine the nMOS threshold voltage (Vtn) (98) for the CMOS IC, i.e. Vtn (35)=Vgs1 (32)–Vro_2 (36).

Various examples of the disclosure have been described. These and other examples are within the scope of the following claims.

The invention claimed is:

1. A circuit comprising:
first circuitry comprising a first current mirror;
a first resistor; and
a second resistor, wherein the first resistor and the second resistor are substantially matched;
second circuitry comprising a second current mirror, wherein:
the second current mirror comprises a first transistor and a second transistor,
a width-to-length ratio of the second transistor is greater than a width-to-length ratio of the first transistor,
the circuit is configured to cause a first current through the first transistor to be substantially equal to a second current through the second transistor and to cause the second current to pass through the first resistor; and a third transistor, wherein:
the second transistor and the third transistor are substantially matched,
the circuit is configured to cause a third current through the third transistor to be substantially equal to the second current through the second transistor and to cause the third current to pass through the second resistor, and
a gate-drain voltage of the third transistor is substantially equal to a voltage across the second resistor;
an output interface configured to output a drain-source voltage across the third transistor.

2. The circuit of claim 1, wherein the width-to-length ratio of the second transistor is approximately four times greater than the width-to-length ratio of the first transistor.

3. The circuit of claim 1, wherein a gate-source voltage of the first transistor approximately equals a sum of a voltage across the first resistor plus a gate-source voltage of the second transistor.

4. The circuit of claim 1, wherein:
the first current mirror comprises pMOS transistors;
the second circuitry and the third transistor comprise nMOS transistors.

5. The circuit of claim 1, wherein:
the first current mirror comprises nMOS transistors;
the second circuitry and the third transistor comprise pMOS transistors.

6. The circuit of claim 1, wherein the circuit is configured to cause a gate-source voltage of the second transistor to be substantially equal to a sum of the voltage across the second resistor plus the drain-source voltage of the third transistor.

7. The circuit of claim 1, wherein the first current mirror comprises a first leg, a second leg and a third leg, and wherein
the first current comprises a current through the first leg,
the second current comprises a current through the second leg,
the third current comprises a current through the third leg.

8. The circuit of claim 7, wherein the third leg comprises a fourth transistor and a gate of the third transistor connects to a node between the second resistor and the fourth transistor.

9. The circuit of claim 1, wherein the drain-source voltage across the third transistor is a CMOS threshold voltage.

10. A system comprising,
a complementary metal-oxide-semiconductor (CMOS) threshold voltage (Vt) extraction circuit, the Vt extraction circuit comprising:
a first circuitry, comprising a first current mirror;
a first resistor; and
a second resistor, wherein the first resistor and the second resistor are substantially matched;
a second circuitry comprising a second current mirror, wherein:
the second current mirror comprises a first transistor and a second transistor,
a width-to-length ratio of the second transistor is greater than a width-to-length ratio of the first transistor,
the circuit is configured to cause a first current through the first transistor to be substantially equal to a second current through the second transistor and to cause the second current to pass through the first resistor; and a third transistor, wherein:
the second transistor and the third transistor are substantially matched,
the circuit is configured to:
cause a third current through the third transistor to be substantially equal to the second current through the second transistor;
cause the third current to pass through the second resistor,
cause a first output voltage of the Vt extraction circuit to be a drain-source voltage across the third transistor; and
cause a gate-drain voltage of the third transistor to be substantially equal to a voltage across the second resistor;
an output leg, the output leg comprising:
a resistance substantially equal to twice a resistance of the first resistor, wherein the circuit is configured to cause a fourth current through the resistance to be substantially equal to the first current;
a second output voltage, wherein the second output voltage comprises a voltage proportional to absolute temperature (V_PTAT).

11. The system of claim 10, wherein the first output voltage is a CMOS threshold voltage.

12. The system of claim 10, wherein the width-to-length ratio of the second transistor is approximately four times greater than the width-to-length ratio of the first transistor.

13. The system of claim 10, wherein the Vt extraction circuit is configured to cause a gate-source voltage of the first transistor to approximately equal a sum of a voltage across the first resistor plus a gate-source voltage of the second transistor.

14. The system of claim 10, wherein:
the first current mirror comprises pMOS transistors;
the second circuitry and the third transistor comprise nMOS transistors.

15. The system of claim 10, wherein:
the first current mirror comprises nMOS transistors;
the second circuitry and the third transistor comprise pMOS transistors.

16. The system of claim 10, wherein the Vt extraction circuit is configured to cause a gate-source voltage of the second transistor to be substantially equal to a sum of a drain-source voltage of the third transistor plus a voltage across the second resistor.

17. A method of determining a complementary metal-oxide-semiconductor (CMOS) threshold voltage (Vt), the method comprising:
directing a first current through a first transistor;
directing a second current through a second transistor, wherein:
the second current is substantially equal to the first current,
the second current passes through a first resistor connected in series to the second transistor, and
the second transistor and the first resistor are configured such that a gate-source voltage of the first transistor equals a sum of a voltage across the first resistor plus a gate-source voltage of the second transistor;
directing a third current through a third transistor, wherein:
the third current is substantially equal to the first current,
the third current passes through a second resistor connected to the third transistor, and the gate-source voltage of the second transistor is substantially equal to a sum of a drain-source voltage across the third transistor plus a voltage across the second resistor, a gate-drain voltage of the third transistor is substantially equal to a voltage across the second resistor, the third transistor and the second transistor are substantially matched, and the second resistor and the first resistor are substantially matched; and determining the drain-source voltage of the third transistor.

18. The method of claim 17, wherein a width-to-length ratio of the second transistor is approximately four times greater than a width-to-length ratio of the first transistor.

19. The method of claim 17, wherein a current mirror directs the first current the first current through the first transistor, the second current through the second transistor and the third current through the third transistor.

20. The method of claim 19, wherein the current mirror comprises pMOS transistors and the first transistor, the second transistor and the third transistor comprise nMOS transistors.

* * * * *